(12) United States Patent
Hasegawa

(10) Patent No.: US 6,333,558 B1
(45) Date of Patent: Dec. 25, 2001

(54) SEMICONDUCTOR DEVICE AND METHOD FOR FABRICATING THE SAME

(75) Inventor: Toshiaki Hasegawa, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/318,737

(22) Filed: May 26, 1999

(30) Foreign Application Priority Data

May 27, 1998 (JP) .................................... 10-145538

(51) Int. Cl.[7] .................................................. H01L 23/48
(52) U.S. Cl. ...................... 257/759; 257/774; 438/624; 438/734
(58) Field of Search ..................................... 257/758, 774, 257/760, 759; 438/734, 744, 723, 743, 624, 623

(56) References Cited

U.S. PATENT DOCUMENTS 5,556,812 * 9/1996 Leuschner et al. ................. 437/209
6,069,400 * 5/2000 Kimura et al. ..................... 257/633

* cited by examiner

*Primary Examiner*—Roy Potter
(74) *Attorney, Agent, or Firm*—Ronald P. Kananen; Rader, Fishman & Grauer PLLC

(57) ABSTRACT

A semiconductor device includes an inorganic insulating film provided on a low-dielectric-constant film, a hole pattern which passes through at least the inorganic insulating film, and a dummy hole pattern which passes through the inorganic insulating film. The dummy hole pattern is preferably formed in a region in which the pattern density of the hole pattern is low. The dummy hole pattern may include a trench or a hole. A method for fabricating a semiconductor device includes the steps of forming an inorganic insulating film on a low-dielectric-constant film, forming a hole pattern which passes through at least the inorganic insulating film, and forming a dummy hole pattern which passes through the inorganic insulating film.

21 Claims, 3 Drawing Sheets

SEMICONDUCTOR DEVICE AND METHOD FOR FABRICATING THE SAME

BACKGROUND OF THE INVENTION

1. Field of the Invention

The present invention relates to a semiconductor device and a method for fabricating the same, and more particularly relates to a semiconductor device in which an inorganic insulating film is provided on a low-dielectric-constant film having a relative dielectric constant in the range of from 1.0 to 3.0 and a hole pattern which passes through at least the inorganic insulating film is formed, and to a method for fabricating the same.

2. Description of the Related Art

As semiconductor devices are miniaturized, the interconnecting line widths must be miniaturized and spaces between lines must be reduced. At the same time, with there being demand for low electric power consumption and faster performance, interlayer insulating films are required to have lower dielectric constants. In particular, in logic devices, since increases in resistance and capacitance between lines due to miniaturized lines result in degradation in signal transmission speed, fine multi-layer wiring having a low-dielectric-constant film as an interlayer insulating film is required.

The miniaturized line width and reduced spaces between lines increase not only the slenderness ratio of lines but also the aspect ratio of spaces between lines, and therefore, a technique for forming slender fine lines, a technique for filling fine spaces between lines with interlayer insulating films, and the like must be adopted, resulting in complex processes and increased numbers of processes.

In accordance with a damascene process in which a via hole and a trench are embedded at the same time by aluminum reflow sputtering, and excess aluminum is polished by chemical mechanical polishing (hereinafter referred to as "CMP") to form an aluminum plug in the via hole and to form an aluminum line in the trench, the number of processes can be greatly decreased because it is not required to form an aluminum line having a high aspect ratio by etching or to fill narrow spaces between lines with an interlayer insulating film. The damascene process greatly contributes to cost reductions as the aspect ratio of lines increases and the number of lines increases.

On the other hand, an interlayer insulating film having a lower dielectric constant decreases capacitance between lines. However, a low-dielectric-constant film having a relative dielectric constant of 3.0 or less to be applied to devices below the 0.18 $\mu$m rule has a film quality which differs greatly from that of a silicon oxide film which is used in conventional devices. Therefore, the development of process techniques for low-dielectric-constant films is sought.

However, since most of the low-dielectric-constant films having a relative dielectric constant of 3.0 or less are composed of an organic material and have low heat resistance, gases are generated at low temperatures (200 to 400° C.). The generation of gases does not occur in silicon-based insulating films which have been conventionally used as interlayer insulating films.

Generally, after via holes and trenches are formed in an interlayer insulating film which uses a low-dielectric-constant film, plugs, lines, and the like are formed within the via holes and the trenches. At this stage, a gas released from the low-dielectric-constant film affects the formation process of a metal film which constitutes lines and the like, and, for example, embedding defects are caused. The gas is released from the low-dielectric-constant film, not because of the decomposition of the low-dielectric-constant film, but because of deterioration such as oxidation. Therefore, the gas is generated at a temperature that is lower than the temperature at which the low-dielectric-constant film originally resists heat. For example, although a fluorinated polyarylether-based resin such as FLARE (trade name) has a glass transition temperature of approximately 400° C. and a thermal decomposition temperature of approximately 500° C., a very small amount of gas is generated at temperatures of approximately 200 to 400° C.

The very small amount of gas is generated mainly in a region in which the pattern density is low, resulting in defects. That is, a silicon-based insulating film formed on a low-dielectric-constant film functions as a so-called "lid", and in a region in which the pattern density of via holes and trenches is low, since an area of the open low-dielectric-constant film is small. the flow rate of the released gas per via hole or trench increases and defects occur therein.

SUMMARY OF THE INVENTION

It is an object of the present invention to provide a semiconductor device and a method for fabricating the same, in which the problems described above are solved. In one aspect, in accordance with the present invention, a semiconductor device includes an inorganic insulating film provided on a low-dielectric-constant film having a relative dielectric constant in the range of from 1.0 to 3.0 and a hole pattern which passes through at least the inorganic insulating film. The semiconductor device further includes a dummy hole pattern which passes through the inorganic insulating film. The dummy hole pattern is formed in a region in which the pattern density of the hole pattern is low.

In the semiconductor device, since the dummy hole pattern which passes through the inorganic insulating film is formed in a region in which the pattern density of the hole pattern is low, gas released from the low-dielectric-constant film is emitted through the hole pattern and the dummy hole pattern. Thus, since the released gas is also dispersed into the dummy hole pattern and is not concentrated in the hole pattern, the amount of gas released from the low-dielectric-constant film per hole pattern is decreased.

In another aspect, in accordance with the present invention, a method for fabricating a semiconductor device includes the steps of: forming an inorganic insulating film on a low-dielectric-constant film having a relative dielectric constant in the range of from 1.0 to 3.0; forming a hole pattern which passes through the inorganic insulating film; and forming a dummy hole pattern. Preferably, the dummy hole pattern is formed in a region in which the pattern density of the hole pattern is low.

In the method for fabricating the semiconductor device, since the dummy pattern which passes through the inorganic insulating film is formed in a region in which the pattern density of the hole pattern is low, gas released from the low-dielectric-constant film is emitted through the hole pattern and the dummy hole pattern. Therefore, since the released gas is also dispersed into the dummy hole pattern and is not concentrated in the hole pattern, the amount of gas released from the low-dielectric-constant film per hole pattern is decreased.

DESCRIPTION OF THE PREFERRED EMBODIMENTS

Figure 1A:
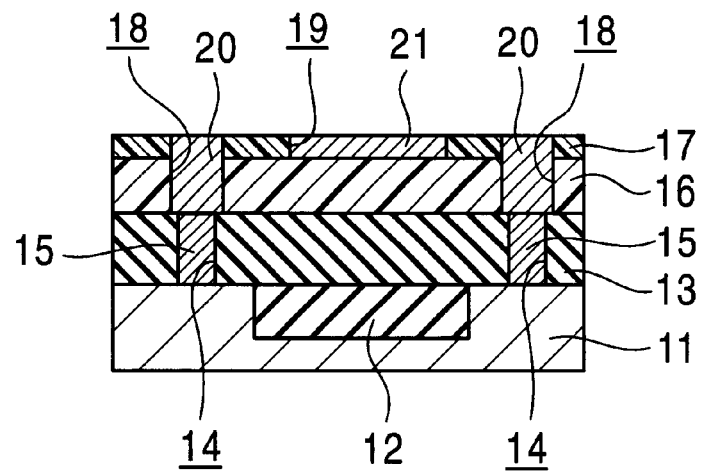
FIGS. 1A and 1B are schematic diagrams which illustrate fabricating steps of a semiconductor device as an embodiment of the present invention.
Figure 1B:
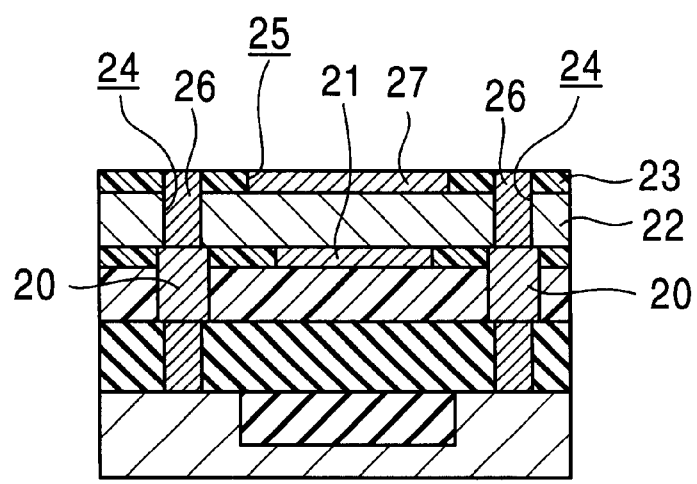

An embodiment of semiconductor devices in accordance with the present invention will be described with reference to schematic diagrams in FIGS. 1A and 1B. FIG. 1A shows an example of a dummy hole pattern provided when a line is formed, and FIG. 1B shows an example of a dummy hole pattern provided when a via plug is formed.

As shown in FIG. 1A, a silicon substrate 11 is provided with an element such as a transistor (not shown in the drawing) and an element isolation insulating film 12. A lower interlayer insulating film 13 is formed on the silicon substrate 11. A contact hole 14 is formed in the lower interlayer insulating film 13 and a contact plug 15 is formed within the contact hole 14. The lower interlayer insulating film 13 is composed of, for example, a silicon-based oxide film containing a silicon oxide film doped with phosphorus or boron, or phosphorus and boron, and the contact plug 15 is composed of, for example, tungsten.

On the lower interlayer insulating film 13, an organic low-dielectric-constant film 16 is formed, for example, at a thickness of 500 nm. As the low-dielectric-constant film 16, for example, fluorocarbon films, arylether-based polymers, benzocyclobutene, polyimides, amorphous carbon, or organic spin-on-glass (SOG) films are used, which have relative dielectric constants of 3.0 or less. As a material for the fluorocarbon films, cyclic fluorocarbon-siloxane copolymers, Teflon (PTFE), polytetrafluoroethylene-based resins, e.g., Teflon AF (trade name) manufactured by DuPont, polyarylether-based resins, e.g., FLARE (trade name), or fluorinated polyimides may be used.

Any polytetrafluoroethylene-based resin having a structure represented by Chemical Formula 1 is acceptable.

[Chemical Formula 1]

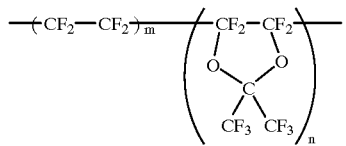

(where m and n are positive integers).

As the low-dielectric-constant film 16, cyclopolymerized fluorinated polymer-based resins, e.g., Cytop (trade name) may be used, which have relative dielectric constants of 3.0 or less. Any cyclopolymerized fluorinated polymer-based resin having a structure represented by Chemical Formula 2 is acceptable.

[Chemical Formula 2]

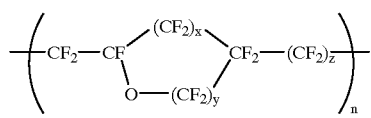

(where x, y, z, and n are positive integers).

With respect to the polyarylether-based resin, any resin having a structure represented by Chemical Formula 3 is acceptable. Alternatively, polyarylether containing fluorine is acceptable, although a structural formula thereof is not shown.

[Chemical Formula 3]

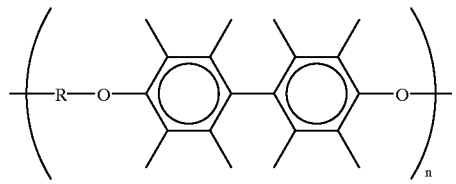

(where R is an alkyl group and n is a positive integer).

On the low-dielectric-constant film 16, an inorganic insulating film 17 Is formed, for example, at a thickness of 100 nm. The inorganic insulating film 17 is composed of, for example, at least one of a silicon oxide film, a silicon nitride film, and a silicon oxynitride film.

On the inorganic insulating film 17 and the low-dielectric-constant film 16, a hole pattern 18 comprising a trench is formed. Although the hole pattern 18 comprises trench, it may comprise a connecting hole (via hole, contact hole, or the like), or may comprise a trench and a connecting hole which is formed on the bottom of the trench. Although the inorganic insulating film 17 is composed of a silicon oxide film in this embodiment, the inorganic insulating film 17 may be composed of titanium nitride, titanium oxynitride, tantalum nitride, tantalum oxide, tantalum oxynitride, tungsten, titanium, tantalum, or the like.

A dummy hole pattern 19 is formed in the inorganic insulating film 17. The dummy hole pattern 19 comprises a trench or a hole which does not contribute to connections between lines, between elements, between a line and an element, or the like, and is disposed so that the pattern density combined with the hole pattern 18 becomes substantially uniform. In this embodiment, the dummy hole pattern 19 comprises a trench.

Specifically, the distance between the dummy hole pattern 19 and the hole pattern 18 is set at the minimum or more, as design permits. When emphasis is laid on performance in particular, the distance is set at twice the minimum or more, as design permits. By setting the distance between the dummy hole pattern 19 and the hole pattern 18 at twice the minimum or more, as design permits, capacitance between a line and a dummy line to be formed within the hole pattern 18 and the dummy hole pattern 19 can be reduced by about half.

As described above, since the dummy hole pattern 19 is formed in addition to the hole pattern 18 in the inorganic insulating film 17 formed in the low-dielectric-constant film 16, gas released from the low-dielectric-constant film 16 is emitted through both the hole pattern 18 and the dummy hole pattern 19 during the subsequent formation of a wiring material layer. Therefore, the amount of gas released per hole pattern 18 is reduced.

Furthermore, a line 20 composed of a wiring material layer is formed within the hole pattern 18 and a dummy pattern 21 composed of a wiring material layer is formed within the dummy hole pattern 19.

An etching stopper layer (not shown in the drawing) composed of a silicon nitride layer, a silicon oxide layer, or a silicon oxynitride layer is formed on the line 20. The etching stopper layer is preferably formed at the smallest possible thickness while maintaining the thickness which allows the etching stopper layer to function as an etching stopper because the layer is used as an etching stopper when a via contact hole is opened. In this embodiment, a silicon nitride film (not shown in the drawing) is formed at a thickness of approximately 10 nm.

In the semiconductor device described above, since the dummy hole pattern 19 which passes through the inorganic insulating film 17 is formed in a region having low pattern density of the hole pattern 18, gas released from the low-dielectric-constant film 16 is emitted through the hole pattern 18 and the dummy hole pattern 19. Therefore, since the released gas is not concentrated in the hole pattern 18 and is dispersed into the dummy hole pattern 19, the amount of gas released per hole pattern 18 is reduced, and embedding defects are decreased during the formation of the wiring material layer.

As shown in FIG. 1B, on the inorganic insulating film 17 of the semiconductor device described with reference to FIG. 1A, a low-dielectric-constant film 22 which covers the line 20, the dummy pattern 21, and so forth, is formed, for example, at a thickness of 500 nm. As the low-dielectric-constant film 22, when emphasis is laid on device performance, for example, fluorocarbon films, arylether-based polymers, benzocyclobutene, polyimides, amorphous carbon, or organic spin-on-glass (SOG) films are used. As a material for the fluorocarbon films, cyclic fluorocarbon-siloxane copolymers, Teflon (PTFE), polytetrafluoroethylene-based resins, e.g., Teflon AF (trade name) manufactured by DuPont, polyarylether-based resins, e.g., FLARE (trade name), or fluorinated polyimides may be used. Alternatively, organic SOG films having a relatively high dielectric constant, fluorine-doped silicon oxide films, or the like may be used.

On the low-dielectric-constant film 22, an inorganic insulating film 23 composed of a silicon nitride film, a silicon oxide film, or a silicon oxynitride film is formed.

In the inorganic insulating film 23 and the low-dielectric-constant film 22, a hole pattern 24 comprising a via hole is formed. In the inorganic insulating film 23, a dummy hole pattern 25 comprising a dummy via hole is further formed. Although the dummy hole pattern can be disposed according to minimum design rules in theory, in view of uniformity in etching or the like and possible increase in capacitance between lines, the dummy hole pattern is preferably disposed so that the pattern density of holes is made uniform. Of course, the dummy hole pattern is disposed without short-circuiting the upper wiring.

As described above, since the dummy hole pattern 25 in addition to the hole pattern 24 is formed in the inorganic insulating film 23 formed on the low-dielectric-constant film 22, gas released from the low-dielectric-constant film 22 is emitted through both the hole pattern 24 and the dummy hole pattern 25. Therefore, the amount of gas released per hole pattern 24 is reduced.

Furthermore, a plug material layer composed of, for example, copper is embedded in the hole pattern 24 and the dummy hole pattern 25 to form a via contact plug 26 and a dummy pattern 27. As the plug material layer, in addition to copper, for example, tungsten, aluminum, aluminum alloys, aluminum-silicon, or copper alloys such as copper-zirconium may be used.

Additionally, the wiring layer and the plug layer may be provided in a layered state. The dummy hole pattern 18 may be formed as a hole, and the dummy hole pattern 25 may be formed as a trench.

In the semiconductor device described above, since the dummy hole pattern 25 which passes through the inorganic insulating film 23 is formed in the region having the low pattern density of the hole pattern 24, gas released from the low-dielectric-constant film 22 is emitted through the hole pattern 24 and the dummy hole pattern 25. Therefore, since the released gas is not concentrated in the hole pattern 24 and is dispersed into the dummy hole pattern 25, the amount of gas released from the low-dielectric-constant film 22 per hole pattern 24 is reduced and the embedding defects during the formation of the plug material layer are decreased.

Next, a method for fabricating a semiconductor device in accordance with an embodiment of the present invention will be described with reference to FIGS. 2A through 2C and FIGS. 3A and 3B. FIGS. 2A through 2C and FIGS. 3A and 3B show an example of a method for forming a dummy hole pattern provided when a line is formed and an example of a method for forming a dummy hole pattern provided when a via plug is formed, respectively.

Figure 2A:
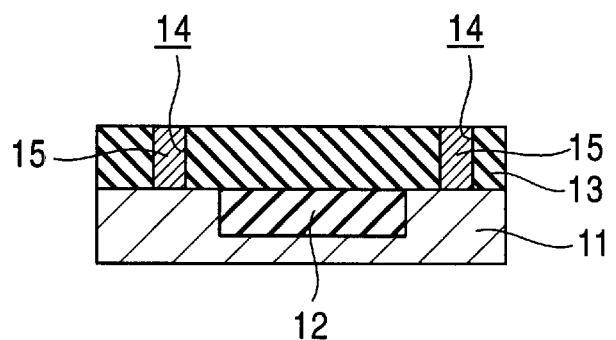
FIGS. 2A through 2C are schematic diagrams which illustrate steps for a method for fabricating a semiconductor device in accordance with an embodiment of the present invention.

As shown in FIG. 2A, after a silicon substrate 11 is provided with an element such as a transistor (not shown in the drawing) and an element isolation insulating film 12, a lower interlayer insulating film 13 is formed on the silicon substrate 11. A contact hole 14 is formed in the lower interlayer insulating film 13, and a contact plug 15 is then formed within the contact hole 14. The element, such as a transistor, the element isolation insulating film 12, the lower interlayer insulating film 13, the contact plug 15, etc., are formed using known techniques. In this example, the lower interlayer insulating film 13 is composed of, for example, a silicon-based oxide film containing a silicon oxide film doped with phosphorus or boron, or phosphorus and boron. The contact plug 15 is composed of, for example, tungsten.

Figure 2B:
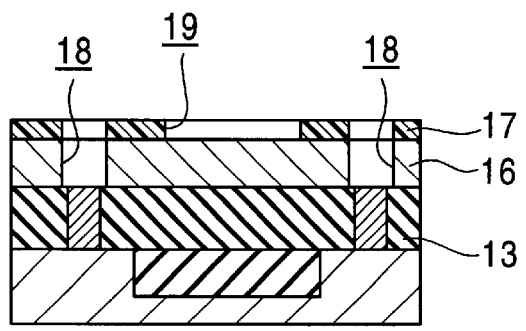

Next, as shown in FIG. 2B, on the lower interlayer insulating film 13, an organic low-dielectric-constant film 16 as an interlayer insulating film is formed, for example, at a thickness of 500 nm. As the low-dielectric-constant film 16, for example, fluorocarbon films, arylether-based polymers, benzocyclobutene, polyimides, amorphous carbon, or organic spin-on-glass (SOG) films are used. As a material for the fluorocarbon films, cyclic fluorocarbon-siloxane copolymers, Teflon (PTFE), polytetrafluoroethylene-based resins, e.g., Teflon AF (™) manufactured by DuPont, polyarylether-based resins, e.g., FLARE (™), or fluorinated polyimide may be used.

With respect to the polytetrafluoroethylene-based resin, any resin having a structure represented by Chemical Formula 1 may be acceptable.

An example of a method for forming the low-dielectric-constant film 16 will be described below. First, a precursor of the low-dielectric-constant film is deposited by rotational coating, followed by curing at 300 to 450° C. to form the low-dielectric-constant film 16. On the other hand, in the case of a material such as amorphous carbon, the low-dielectric-constant film 16 is deposited by a plasma chemical vapor deposition (CVD) system using acetylene, and a fluorocarbon gas as required, also followed by curing at 300 to 450° C.

As the low-dielectric-constant film 16, cyclopolymerized fluorinated polymer-based resins, e.g., Cytop (trade name)

may be used. Any cyclopolymerized fluorinated polymer-based resin having a structure represented by Chemical Formula 2 is acceptable.

With respect to the polyarylether-based resins, any resin having a structure represented by Chemical Formula 3 is acceptable. Alternatively, polyarylether containing fluorine is acceptable although a structural formula thereof is not shown.

Next, on the low-dielectric-constant film 16, an inorganic insulating film 17 is formed, for example, at a thickness of 100 nm. The inorganic insulating film 17 is composed of, for example, at least one of a silicon oxide film, a silicon nitride film, and a silicon oxynitride film. The formation is performed by a known plasma CVD process in a reducing atmosphere. If the inorganic insulating film 17 is deposited by the CVD process in an oxidizing atmosphere, the low-dielectric-constant film 16 is oxidized, resulting in separation of the film or the like. Accordingly, the film must be deposited in a reducing atmosphere.

For example, when a silicon oxide film is deposited, a plasma CVD system is employed, using a process gas containing monosilane ($SiH_4$) [feed rate: 50 sccm] and nitrogen monoxide ($N_2O$) gas [feed rate: 100 sccm], for example, with a plasma power of 500 W and an atmospheric pressure of formation of 1.33 kPa at a deposition temperature of 350° C.

Next, an etching mask (not shown in the drawing) is formed for forming a trench by resist coating and a lithography technique. Using the etching mask, etching is performed to form a hole pattern 18 comprising a trench in the inorganic insulating film 17 and the low-dielectric-constant film 16. Although the hole pattern 18 comprises a trench, for example, it may comprise a connecting hole (via hole, contact hole, or the like), or may comprise a trench and a connecting hole which is formed on the bottom of the trench.

When the inorganic insulating film 17 is a silicon oxide film, etching is performed, for example, using an etching gas containing hexafluoroethane ($C_2F_6$) [feed rate: 14 sccm], carbon monoxide (CO) [feed rate: 180 sccm], argon (Ar) [feed rate: 240 sccm], and oxygen ($O_2$) [feed rate: 6 sccm] and setting an RF plasma at 1.5 kW.

The low-dielectric-constant film 16 is etched, for example, using an etching gas containing trifluoromethane ($CHF_3$) [feed rate: 5 sccm], oxygen ($O_2$) [feed rate: 50 sccm], and helium (He) [feed rate: 200 sccm], with an RF plasma of 500 W at an etching temperature of −10° C.

The upper inorganic insulating film 17 also functions as an etching mask when the low-dielectric-constant film 16 is etched. That is, when the low-dielectric-constant film 16 is etched, the resist mask is also etched. Although the silicon oxide film of the inorganic insulating film 17 is an etching mask in this embodiment, instead of an etching mask formed of the resist, a film composed of titanium nitride, titanium oxynitride, tantalum nitride, tantalum oxide, tantalum oxynitride, tungsten, titanium, tantalum, or the like may be used as an etching mask.

Then, the etching mask is removed. Again, an etching mask (not shown in the drawing) is formed for forming a dummy hole pattern by resist coating and a lithography technique, and etching is performed using the etching mask to form a dummy hole pattern 19 in the inorganic insulating film 17. The dummy hole pattern 19 is a trench or a hole which does not contribute to connections between lines, between elements, between a line and an element, or the like, and is disposed so that the pattern density combined with the hole pattern 18 comprising a trench becomes substantially uniform.

Specifically, the distance between the dummy hole pattern 19 and the hole pattern 18 is set at a minimum or more, as design permits. When emphasis is laid on performance in particular, the distance is set at twice the minimum or more, as design permits. By setting the distance between the dummy hole pattern 19 and the hole pattern 18 at twice the minimum or more, as design permits, capacitance between lines can be reduced by about half.

As described above, since the dummy hole pattern 19 is formed in addition to the hole pattern 18 in the inorganic insulating film 17 formed on the low-dielectric-constant film 16, during the subsequent formation of a wiring material layer, gas released from the low-dielectric-constant film 16 is emitted through both the hole pattern 18 and the dummy hole pattern 19. As a result, the amount of the gas released from the low-dielectric-constant film 16 per hole pattern 18 is reduced.

Figure 2C:
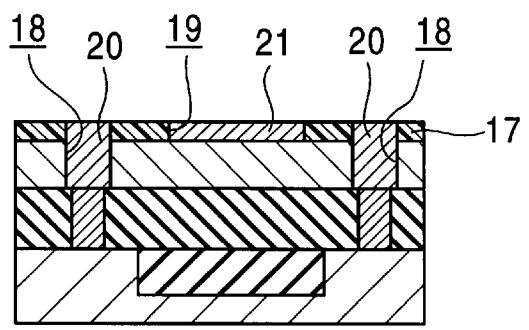

Then, the etching mask is removed. Next, as shown in FIG. 2C, a line is formed by a damascene process. First, a wiring material layer for filling the hole pattern 18 comprising a trench and the dummy hole pattern 19 is formed by depositing copper, for example, by sputtering or by a CVD process. Excess copper on the inorganic insulating film 17 is removed by polishing using CMP. The inorganic insulating film 17 is then polished by a thickness of approximately 50 nm. The CMP of the inorganic insulating film 17 thoroughly removes copper on the inorganic insulating film 17 and removes scratches on the inorganic insulating film 17. Consequently, a line 20 composed of the wiring material layer is formed within the hole pattern 18 and a dummy pattern 21 composed of the wiring material embedded within the dummy hole pattern 19 is formed.

Next, although not shown in the drawing, the inorganic insulating film 17 is etched by a typical magnetron etching system, using an etching gas containing hexafluoroethane ($C_2F_6$) [feed rate: 14 sccm], carbon monoxide (CO) [feed rate: 180 sccm], and argon (Ar) [feed rate: 240 sccm]. An organic film is not significantly etched by the above etching gas. This etching removal step of the inorganic insulating film 17 may be omitted when emphasis is laid on reliability of the device rather than performance of the device.

Next, an etching stopper layer (not shown in the drawing), which is composed of a silicon nitride film, a silicon oxide film, or a silicon oxynitride film, is formed on the line 20. The etching stopper layer is preferably formed at the smallest possible thickness while maintaining the thickness which allows the etching stopper layer to function as an etching stopper because the layer is used as an etching stopper when a via contact hole is opened. In this embodiment, a silicon nitride film (not shown in the drawing) is formed at a thickness of approximately 10 nm.

Figure 3A:
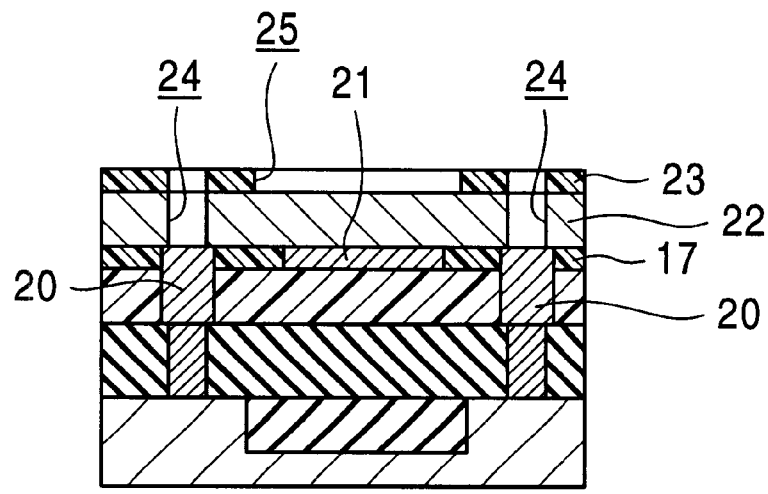
FIGS. 3A and 3B are schematic diagrams which illustrate steps (continuation) for a method for fabricating a semiconductor device in accordance with an embodiment of the present invention.

Next, as shown in FIG. 3A, using a typical CVD system or rotational coating system, on the inorganic insulating film 17, a low-dielectric-constant film 22 for covering the line 20 and the dummy pattern 21 is formed, for example, at a thickness of 500 nm. As the low-dielectric-constant film 22, when emphasis is laid on performance of the device, for example, fluorocarbon films, arylether-based polymers, benzocyclobutene, polyimides, amorphous carbon, or organic spin-on-glass (SOG) films are used. As a material for the fluorocarbon films, cyclic fluorocarbon-siloxane copolymers, Teflon (PTFE), polytetrafluoroethylene-based resins, e.g., Teflon AF (trade name) manufactured by DuPont, polyarylether-based resins, e.g., FLARE (™), or fluorinated polyimides may be used. Alternatively, organic SOG films having a relatively high dielectric constant, fluorine-doped silicon oxide films, or the like may be used.

Next, on the low-dielectric-constant film 22, an inorganic insulating film 23 composed of a silicon nitride film, a silicon oxide film, or a silicon oxynitride film is formed. Although the inorganic insulating film 23 is generally formed using a CVD system, a rotational coating system, an evaporation system, a sputtering system, or the like may be used for the formation.

Next, an etching mask (not shown in the drawing) is formed for forming a hole pattern comprising a via hole by resist coating and a lithography technique. Using the etching mask, etching is performed to form a hole pattern 24 comprising a via hole in the inorganic insulating film 23 and the low-dielectric-constant film 22. In the etching, for example, a typical magnetron etching system is employed.

When the inorganic insulating film 23 is etched, an etching gas containing hexafluoroethane ($C_2F_6$) [feed rate: 14 sccm], carbon monoxide (CO) [feed rate: 180 sccm], argon (Ar) [feed rate: 240 sccm], and oxygen ($O_2$) [feed rate: 6 sccm] is used and RF plasma is set at 1.5 kW. When the low-dielectric-constant film 22 is etched, an etching gas containing trifluoromethane ($CHF_3$) [feed rate: 5 sccm], oxygen ($O_2$) [feed rate: 50 sccm], and helium (He) [feed rate: 200 sccm] is used, with an RF plasma of 500 W at an etching temperature of −10° C.

When the low-dielectric-constant film 22 is etched, the inorganic insulating film 23 functions as an etching mask. That is, when the low-dielectric-constant film 22 is etched, the resist is also etched. Although in this embodiment the inorganic insulating film 23 composed of a silicon oxide film is used as an etching mask for the low-dielectric-constant film 22, besides the inorganic insulating film 23, a film composed of titanium nitride, titanium oxynitride, tantalum nitride, tantalum oxide, tantalum oxynitride, tungsten, titanium, or tantalum may be formed for use as an etching mask.

Then, the etching mask is removed. Next, an etching mask (not shown in the drawing) is formed for forming a dummy hole pattern by resist coating and a lithography technique. Although a hole for forming the dummy hole pattern in the etching mask can be disposed according to minimum design rules in theory, in view of uniformity etching or the like and possible increase in capacitance between lines, the hole is preferably disposed so that the pattern density of holes is made uniform. Of course, the hole is disposed without short-circuiting the upper wiring.

Next, etching is performed using the etching mask (not shown in the drawing), and a dummy hole pattern 25 comprising a dummy via hole is formed in the inorganic insulating film 23. The inorganic insulating film 23 is etched, for example, by a typical magnetron etching system.

For the above etching, for example, an etching gas containing hexafluoroethane ($C_2F_6$) [feed rate: 14 sccm], carbon monoxide (CO) [feed rate: 180 sccm], argon (Ar) [feed rate: 240 sccm], and oxygen ($O_2$) [feed rate: 6 sccm] is used, and RF plasma is set at 1.5 kW.

Then, the etching mask is removed. Next, although not shown in the drawing, the inorganic insulating film 23 is removed using a typical magnetron etching system. As the etching gas, a mixture of hexafluoroethane ($C_2F_6$) [feed rate: 14 sccm], carbon monoxide (CO) [feed rate: 180 sccm], and argon (Ar) [feed rate: 240 sccm] is used. An organic film is not significantly etched by the etching gas. This etching removal step of the inorganic insulating film 17 may be omitted when emphasis is laid on reliability of the device rather than on performance of the device.

As described above, since the dummy hole pattern 25 is formed in addition to the hole pattern 24 in the inorganic insulating film 23 formed on the low-dielectric-constant film 23, during the subsequent formation of a wiring material layer, gas released from the low-dielectric-constant film 16 is emitted through both the hole pattern 24 and the dummy hole pattern 25. As a result, the amount of the gas released from the low-dielectric-constant film 22 per hole pattern 24 is reduced.

Figure 3B:
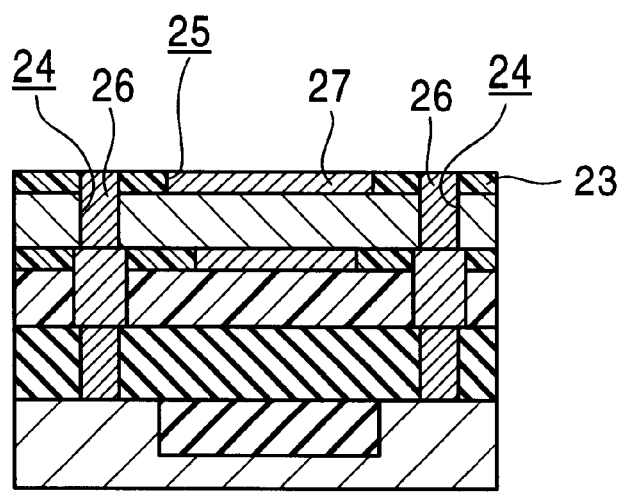

Next, as shown in FIG. 3B, a via contact plug is formed by a damascene process. First, a plug material layer for filling the hole pattern 24 comprising a via hole and the dummy hole pattern 25 is formed on the inorganic insulating film 23 by depositing copper, for example, by sputtering or by a CVD process. Next, excess copper on the inorganic insulating film 23 is removed by polishing using CMP. The inorganic insulating film 23 is further polished by a thickness of approximately 50 nm. The CMP of the inorganic insulating film 23 thoroughly removes copper on the inorganic insulating film 23 and removes scratches on the inorganic insulating film 23. As a result, a via contact plug 26 composed of the plug material layer is formed within the hole pattern 24 and a dummy pattern 27 is also formed within the dummy hole pattern 25 with the plug material layer being filled.

Although the plug material layer is composed of copper, it may be possible to use, for example, tungsten, aluminum, aluminum alloys, aluminum-silicon, or copper alloys such as copper-zirconium.

Next, the process for forming a line and the process for forming a plug may be repeated as required. In the method for fabricating the semiconductor device described above, since the dummy hole pattern 19 which passes through the inorganic insulating film 17 is formed in a region having a low pattern density of the hole pattern 18, the gas released from the low-dielectric-constant film 16 is emitted through the hole pattern 18 and the dummy hole pattern 19. Therefore, since the gas released is not concentrated in the hole pattern 18 and is also dispersed to the dummy hole pattern 19, the amount of the gas released from the low-dielectric-constant film 16 per hole pattern 18 is reduced and embedding defects during the formation of the wiring material layer are decreased. Similarly, since the dummy hole pattern 25 which passes through the inorganic insulating film 23 is formed in a region having a low pattern density of the hole pattern 24, the gas released from the low-dielectric-constant film 22 is emitted through the hole pattern 24 and the dummy hole pattern 25. Therefore, since the gas released is not concentrated in the hole pattern 24 and is also dispersed to the dummy hole pattern 25, the amount of the gas released from the low-dielectric-constant film 16 per hole pattern 24 is reduced and embedding defects during the formation of the plug material layer are decreased.

Although the low-dielectric-constant films 16 and 22 are composed of an organic film in the embodiments described above, an inorganic material such as a xerogel may be used. In such a case, the advantage of forming the dummy hole patterns 19 and 25 is also obtained. Additionally, when an inorganic film such as a xerogel is used as the low-dielectric-constant film, a material having a different composition such as a silicon nitride film is used as an etching mask for etching the low-dielectric-constant film. A resist mask may also be used.

Although the dummy hole patterns 19 and 25 may pass through the low-dielectric-constant films 16 and 22, if etching is performed on the inorganic insulating films 17 and 23 only as described above, gases released from the low-dielectric-constant films 16 and 22 are effectively emitted. That is, the dummy hole patterns 19 and 25 can be formed, only taking the via hole or the wiring layer into consideration, without considering short-circuiting of lower wiring.

As described above, in the semiconductor device in accordance with the present invention, since the dummy hole pattern which passes through the inorganic insulating film is formed in a region in which the pattern density of the hole pattern is low, the gas released from the low dielectric film is also dispersed to the dummy hole pattern and is emitted through the dummy hole pattern. Therefore, since the amount of gas released from the low-dielectric-constant film per hole pattern is decreased, a line or a plug formed within the hole pattern will be highly reliable.

In accordance with the method for fabricating the semiconductor device in the present invention, since the dummy hole pattern which passes through the inorganic insulating film is formed in a region in which the pattern density of the hole pattern is low, the gas released from the low dielectric film can be dispersed to the dummy hole pattern and emitted through the dummy hole pattern. As a result, since the amount of gas released from the low-dielectric-constant film per hole pattern can be decreased, embedding defects of the material layer in the hole pattern can be eliminated. Therefore, even if a damascene process is applied to the interlayer insulating film containing the low-dielectric-constant film, multi-layer wiring in which capacitance between lines is low can be formed at a high yield.

What is claimed is:

1. A semiconductor device comprising:
   an inorganic insulating film provided on a low-dielectric-constant film having a relative dielectric constant in the range of from 1.0 to 3.0;
   a hole pattern passing through at least the inorganic insulating film; and
   a dummy hole pattern passing through the inorganic insulating film.

2. A semiconductor device according to claim 1, wherein the dummy hole pattern is formed in a region having a low pattern density of the hole pattern.

3. A semiconductor device according to claim 1, wherein the dummy hole pattern comprises one of a trench and a hole.

4. A semiconductor device according to claim 2, wherein the dummy hole pattern comprises one of a trench and a hole.

5. A method for fabricating a semiconductor device, comprising the steps of:
   forming an inorganic insulating film on a low-dielectric-constant film having a relative dielectric constant in the range of from 1.0 to 3.0;
   forming a hole pattern passing through at least the inorganic insulating film; and
   forming a dummy hole pattern passing through the inorganic insulating film.

6. A method for fabricating a semiconductor device according to claim 5, wherein the dummy hole pattern is formed in a region having a low pattern density of the hole pattern.

7. A method for fabricating a semiconductor device according to claim 5, wherein the dummy hole pattern comprises one of a trench and a hole.

8. A method for fabricating a semiconductor device according to claim 6, wherein the dummy hole pattern comprises one of a trench and a hole.

9. A method for fabricating a semiconductor device according to claim 5, wherein said low-dielectric-constant film is composed of material selected from the group consisting of a fluorocarbon film, arylether-based polymers, benzocyclobutene, polyimides, amorphous carbon, and organic spin-on-glass films.

10. A method for fabricating a semiconductor device according to claim 5, wherein said low-dielectric-constant film is a fluorocarbon film selected from the group of materials consisting of cyclic fluororcarbon-siloxane copolymers, polytetrafluoroethylene, a polytetrafluoroethylene-based resin, a polyarylether-based resin, a fluorinated polyimide, and a cyclopolymerized fluorinated polymer-based resin.

11. A method for fabricating a semiconductor device according to claim 10, wherein said fluorocarbon film is a polytetrafluoroethylene-based resin having a structure represented by the formula:

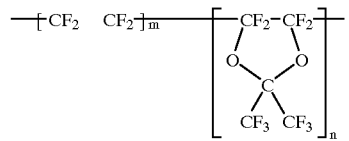

where m and n are positive integers.

12. A method for fabricating a semiconductor device according to claim 10, wherein said fluorocarbon film is a cyclopolymerized fluorinated polymer based resin having a structure represented by the following formula:

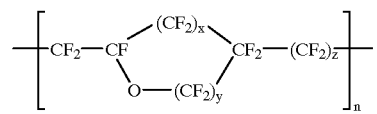

where x, y, z, and n are positive integers.

13. A method for fabricating a semiconductor device according to claim 5, wherein said inorganic insulating film is selected from the group consisting of a silicon oxide film, a silicon nitride film, and a silicon oxynitride film.

14. A method for fabricating a semiconductor device according to claim 5, wherein said low-dielectric-constant film is formed on an interlayer insulating film.

15. A method for fabricating a semiconductor device according to claim 5, wherein said inorganic insulating film is deposited by a plasma CVD process in a reducing atmosphere.

16. A semiconductor device according to claim 1, wherein said low-dielectric-constant film is composed of material selected from the group consisting of a fluorocarbon film, arylether-based polymers, benzocyclobutene, polyimides, amorphous carbon, and organic spin-on-glass films.

17. A semiconductor device according to claim 1, wherein said low-dielectric-constant film is a fluorocarbon film selected from the group of materials consisting of cyclic fluororcarbon-siloxane copolymers, polytetrafluoroethylene, a polytetrafluoroethylene-based resin, a polyarylether-based resin, a fluorinated polyimide, and a cyclopolymerized fluorinated polymer-based resin.

18. A semiconductor device according to claim 17, wherein said fluorocarbon film is a polytetrafluoroethylene-based resin having a structure represented by the formula:

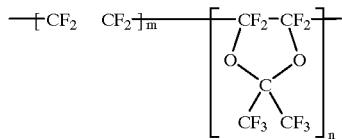

where m and n are positive integers.

19. A semiconductor device according to claim 17, wherein said fluorocarbon film is a cyclopolymerized fluorinated polymer based resin having a structure represented by the following formula:

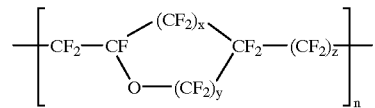

where x, y, z, and n are positive integers.

20. A semiconductor device according to claim 1, wherein said inorganic insulating film is selected from the group consisting of a silicon oxide film, a silicon nitride film, and a silicon oxynitride film.

21. A semiconductor device according to claim 1, wherein said low-dielectric-constant film is formed on an interlayer insulating film.

* * * * *